US007028696B2

(12) United States Patent
Richardson et al.

(10) Patent No.: US 7,028,696 B2
(45) Date of Patent: Apr. 18, 2006

(54) PLASMA CLEANING OF DEPOSITION CHAMBER RESIDUES USING DUO-STEP WAFER-LESS AUTO CLEAN METHOD

(75) Inventors: Brett C. Richardson, San Ramon, CA (US); Vincent Wong, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 527 days.

(21) Appl. No.: 10/139,042

(22) Filed: May 3, 2002

(65) Prior Publication Data

US 2003/0000546 A1    Jan. 2, 2003

Related U.S. Application Data

(60) Provisional application No. 60/288,678, filed on May 4, 2001.

(51) Int. Cl.
*B08B 7/04* (2006.01)
(52) U.S. Cl. .................. 134/1.1; 134/1; 134/22.1; 134/22.18; 134/26; 134/30; 438/905
(58) Field of Classification Search .............. 134/1, 134/1.1, 22.1, 22.18, 26, 30; 438/905
See application file for complete search history.

(56) References Cited

U.S. PATENT DOCUMENTS 5,620,526 A    4/1997  Watatani et al.
5,647,953 A  * 7/1997  Williams et al. .......... 134/1.1
5,843,239 A  * 12/1998 Shrotriya .................. 134/1.1
5,846,373 A    12/1998 Pirkle et al.
5,935,340 A  * 8/1999  Xia et al. .................. 134/1.1
6,125,859 A  * 10/2000 Kao et al. .................. 134/1.1

FOREIGN PATENT DOCUMENTS

EP     0 933 803 A1    8/1999
EP     0 933 806 A1    8/1999

* cited by examiner

*Primary Examiner*—Alexander Markoff
(74) *Attorney, Agent, or Firm*—Martine Penilla & Gencarella, LLP

(57) ABSTRACT

A method involving plasma cleaning of deposit residues in process chamber using duo-step wafer-less auto clean method is detailed. Specifically, the method involves cleaning the processing chamber by flowing a first gaseous composition with at least about 75% of fluorine-containing compound of the formula $X_yF_z$, into a processing chamber and then forming a first etchant plasma which removes silicon and silicon based byproducts from the interior surfaces of the processing chamber. The method then involves flowing a second gaseous composition into the processing chamber with a composition of at least about 50% $O_2$ and forming a plasma from the second gaseous composition to provide a second etchant plasma which removes carbon and carbon based byproducts from the interior surfaces of the processing chamber. A system configured to execute the two step cleaning process is also provided.

29 Claims, 7 Drawing Sheets

PLASMA CLEANING OF DEPOSITION CHAMBER RESIDUES USING DUO-STEP WAFER-LESS AUTO CLEAN METHOD

CROSS REFERENCE TO RELATED APPLICATIONS

This application claims priority from U.S. Provisional Patent Application No. 60/288,678 filed May 4, 2001 and entitled "Plasma Cleaning of Deposition Chamber Residues Using Duo-Step Wafer-Less Auto Clean Method." This provisional application is herein incorporated by reference. This application is related to (1) U.S. patent application Ser. No. 10/138,288, filed on May 3, 2002, and entitled "Endpoint Determination of Process Residues in Wafer-less Auto Clean Process Using Optical Emission Spectroscopy," (2) U.S. patent application Ser. No. 10/138,288, filed May 2, 2002, and entitled "High Pressure Wafer-less Auto Clean for Etch Applications," These applications are hereby incorporated by reference.

FIELD OF THE INVENTION

This invention generally relates to an apparatus and method of cleaning a processing chamber to remove previously deposited chamber residues, which have accumulated on interior surfaces of the apparatus. In particular, the invention relates to wafer-less plasma cleaning methods for elimination of residues on interior walls, or other components using a two step cleaning process.

BACKGROUND OF THE INVENTION

In a conventional plasma process, plasma is activated by reactive gaseous species so that a desired film can be produced on the substrate or removed from the substrate. The chemically reactive species includes ions, neutral atoms, and molecules. When a chemical process, such as plasma etching, is involved, reactive species interact chemically or physically with the material to be etched.

The chemically reactive species are chosen carefully so that the species are specific to the surface of the substrate that it is going to interact with. In general, the plasma is controlled by one or more process parameters, such as: wafer temperature, chamber surface temperature, pressure, reactant gas flow rate, reactant gas mix, reactant gas concentration, gas injection distribution, plasma ion density, and bias voltage. Often such process parameters are optimized for the reactant species on dummy wafers. The optimization of the process parameters and the choice of chemically reactive species are done for the specific process in the form of design of experiments (more often called a DOE).

Although care and caution is involved during the monitoring of a chemical process, more often than not, undesired residues are deposited on the inner surfaces of the process chambers where the processes are taking place. The undesired residues, unfortunately, get deposited in and around the walls of the processing chamber. The build up of residues inside the processing chamber, over time, not only make the processes unreliable and shifted from baseline, but also result in degraded, defective substrates in the form of defects. Without frequent cleaning procedures, impurities from the residue build up can migrate onto the substrate. In addition, process etch rates or deposition rates can vary over time due to the changing chamber conditions from residue build-up resulting in out of control process performance. Thus, the maintenance of the processing equipment is important not only for higher yields and better product performance of current products but also in the development of future generation products.

An important technique to improve the overall quality and efficiency in the processing of devices is to clean the chamber of any deposits. Two methods of cleaning a process chamber are dry etch cleaning and wet cleaning. In the former cleaning operation, process gases are evacuated from the processing chamber and one or more process cleaning gases are introduced. Energy is applied to promote a reaction between the gases and any residues, which may have accumulated on the processing chamber's interior surfaces. Residues on the processing chamber's interior react with the cleaning process gases, forming gaseous by-products which are then exhausted from the processing chamber, along with unreacted portions of the cleaning process gases. The cleaning process is followed by the resumption of normal processing.

An alternative to dry etching i.e., the in-situ cleaning procedure, in which the processing chamber remains sealed, is a wet cleaning procedure that is performed by breaking the processing chamber's vacuum seal and manually wiping down the chamber's interior surfaces. A wet cleaning procedure is normally performed to remove residues that are not entirely removed by the in-situ cleaning process, and tend to accumulate over time. A solvent is sometimes used to dissolve these residues. Once cleaned, the processing chamber is sealed and normal processing is resumed.

Unfortunately, such cleaning operations affect a substrate processing system's utilization in a variety of ways. For example, system utilization is reduced by the time involved in performing cleaning operations. When a wet clean is performed, opening the processing chamber and physically wiping the chamber's interior surfaces results in even more downtime because the processing environment must subsequently be re-stabilized. The re-stabilization of the chamber condition requires processing many wafers to condition the chamber back to the pre-wet clean operating chamber state without excessive residue build-up.

FIG. 1 is a flowchart diagram of the method operations for a composite one step cleaning process for the removal of all chamber deposition byproducts. The method initiates with operation 10 where dummy wafers are processed to check for process readiness. The method then advances to operation 12 where production wafers are processed. Then, the method moves to operation 14 where the etchants for both silicon based byproduct removal and carbon based byproduct removal are combined to run a single step cleaning operation. If there are more wafers to be processed, the production wafers are rerun through operations 12 and 14. The method operations of FIG. 1 can also be performed in wafer-less conditions, in which case it is considered a one-step (composite) wafer-less auto clean (WAC) process. Although in some instances, there may be multiple steps, all these steps are still repeating composite (both silicon based byproduct removal and carbon based byproduct removal together) one-step wafer-less auto clean (WAC) processes.

Although such a recipe has the advantage that the number of process steps can be reduced or not, it fails to ensure complete removal of different byproducts, such as carbon based organic residues and semiconductor based silicon residues. In fact, the removal rates for silicon and carbon deposition are in opposition to each other. The process trends for silicon removal are based primarily on fluorine-based chemistry while carbon removal are based primarily on oxygen-based chemistry. As both fluorine-based and oxygen-based chemistries are mixed together, the removal rates of both silicon and carbon are not at optimal levels. As the $O_2$ concentration increases in the mixture above a certain limit, the silicon removal rate becomes saturated and reduces substantially. Rather both silicon and carbon rates are compromised in a one step composite approach with an immediate removal rate. Thus, the one step approach can not yield optimized removal rates for silicon and carbon deposition. In the past, plasma cleans were used for cleaning etch reactors and deposition reactors with the wafer in the chamber to cover the electrode, but it has become more common to do wafer-less plasma cleans. This has led to the use of a wafer-less auto clean (WAC).

When a composite WAC recipe for both silicon and carbon byproduct removal is used involving a specific mixture of separate etchant gases for silicon removal and for carbon removal, it suffers from non-optimized lower removal rates of both silicon and carbon-based deposition byproducts. That is, the one step composite WAC approach is not tuned to achieve complete by-product removal of both the silicon and the carbon by-products. In effect, the one step composite WAC approach compromises the effectiveness of the removal of the byproducts for the convenience of using a single all-encompassing WAC chemistry. Thus, the composite WAC recipe removes both byproduct materials at a mid-range removal rate that may remove too much of one byproduct and not enough of another byproduct. Consequently, the chamber will be under-cleaned which results in a build up of material, or the chamber will be over-cleaned which results in the degradation of chamber parts and a shortening of their lifetime. Moreover, when fluorine containing cleaning gases are used with the composite WAC recipe, non volatile aluminum fluoride compounds are formed which build up on the inner surfaces of the chamber. The build up of these compounds causes variability of the plasma processing operations performed in the processing chamber. Eventually, the build up can flake off and deposit onto a wafer being processed.

Another shortcoming of frequent cleaning operations is that they tend to increase wear on the processing chamber components when over-cleaning occurs resulting in decreased lifetime of the components. In turn, the cost of consumables increases. Thus, improved methods and apparatus for cleaning semiconductor process chambers are needed. In particular, the cleaning methods and apparatus should be capable of removing the residues created during substrate processing operations, while reducing or eliminating the subsequent formation of cleaning residues.

In view of the foregoing, what is needed is a semiconductor processing chamber configured to optimize chamber byproduct removal of silicon and carbon based byproducts, such that the removal of the silicon based byproducts and the carbon based byproducts is achieved in an efficient manner to provide a consistent environment inside the chamber for each successive semiconductor substrate being processed.

SUMMARY OF THE INVENTION

The present invention provides a method and apparatus configured for removing silicon and carbon based deposition byproducts using a two-step cleaning process where each step of the cleaning process is optimized for removing a specific byproduct. The first step of the two-step cleaning process is optimized for removing silicon-based chamber byproducts while the second step of the two-step cleaning process is optimized for the removal of carbon-based deposition byproducts. It should be appreciated that the present invention can be implemented in numerous ways, including as an apparatus, a system, a device, or a method. Several inventive embodiments of the present invention are described below.

In one embodiment, the method for wafer-less auto clean process (WAC) involves cleaning the processing chamber by flowing a first gaseous composition into a processing chamber including at least about 75% of a fluorine-containing compound of the formula $X_yF_z$. Then, a plasma is formed from this first gaseous composition to provide a first etchant plasma which removes silicon and silicon based compounds from the interior surfaces of the processing chamber. The next step involves flowing a second gaseous composition into the same processing chamber, of a composition including at least about 50% oxygen of chemical formula $O_2$. Then, a plasma is formed from the second gaseous composition to provide a second etchant plasma which removes carbon and carbon based compounds from interior surfaces of the processing chamber.

In another embodiment of the present invention, the wafers are processed by first cleaning interior surfaces of a process chamber with a fluoride plasma including at least about 75% of a fluorine-containing compound of the formula $X_yF_z$, with the plasma being optimized to remove silicon and silicon compounds and secondly, cleaning the interior surfaces of the process chamber with an oxygen plasma including at least about 50% $O_2$, such that the oxygen plasma is optimized to remove carbon and carbon compounds. The wafer can be processed in the process chamber after the first and second cleaning processes.

In yet another embodiment, a process for cleaning the interior surfaces of a processing chamber is provided. The process steps for cleaning the interior surfaces of a processing chamber for silicon and silicon compounds includes the steps of first flowing an etchant process gas with a fluorine-containing compound of the formula $X_yF_z$ optimized to remove silicon and silicon compounds. Then, a plasma is formed from the etchant process gas with the fluorine-containing compound. A pressure within the processing chamber is maintained at a pressure range between about 2–100 mTorr. The process is monitored for silicon and silicon compounds on interior surfaces of the processing chamber so that a predetermined level can be ascertained.

The process steps for removing carbon based compounds includes first flowing an etchant process gas containing oxygen, and an optional fluorine-containing compound of the formula $X_yF_z$, in trace amounts such that the fluorine-containing compound is optimized to remove silicon and silicon compounds from the previous process step in the two-step process. The plasma formed from the etchant process gas containing oxygen is maintained at a pressure range of about 10–100 mTorr inside the processing chamber. The process for removing carbon-based compounds is monitored on interior surfaces of the processing chamber so that a predetermined level is reached.

In still yet another embodiment of the invention, a plasma processing system for executing a two step in-situ cleaning process is provided. The plasma system includes a processing chamber having a gas inlet for introducing a first cleaning gas and a second cleaning gas, the first cleaning gas optimized to remove silicon based byproducts deposited on inner surfaces of the processing chamber, the second cleaning gas optimized to remove carbon based byproducts on the inner surfaces of the processing chamber. The processing chamber also includes a top electrode for creating a first plasma from the first cleaning gas to perform a first step of the in-situ cleaning process and then a second plasma from the second cleaning gas upon completion of the first step. A variable conductance meter for controlling a pressure inside the processing chamber independently of a flow rate of the process gases is included. The variable conductance meter is positioned on an outlet of the processing chamber. There is an electrostatic chuck for wafer clamping and temperature control of the wafer. An optical emission spectrometer (OES) for detecting an endpoint for each step of the two step in-situ cleaning process performed in the processing chamber is included. The OES is in communication with the processing chamber. A pumping system for evacuating the processing chamber between each step of the two step cleaning process is included.

Other aspects and advantages of the invention will become apparent from the following detailed description, taken in conjunction with the accompanying drawings, illustrating by way of example the principles of the invention.

BRIEF DESCRIPTION OF DRAWINGS

The present invention will be readily understood by the following detailed description in conjunction with the accompanying drawings, with like reference numerals designating like elements.

DETAILED DESCRIPTION OF THE PREFERRED EMBODIMENTS

Figure 1:
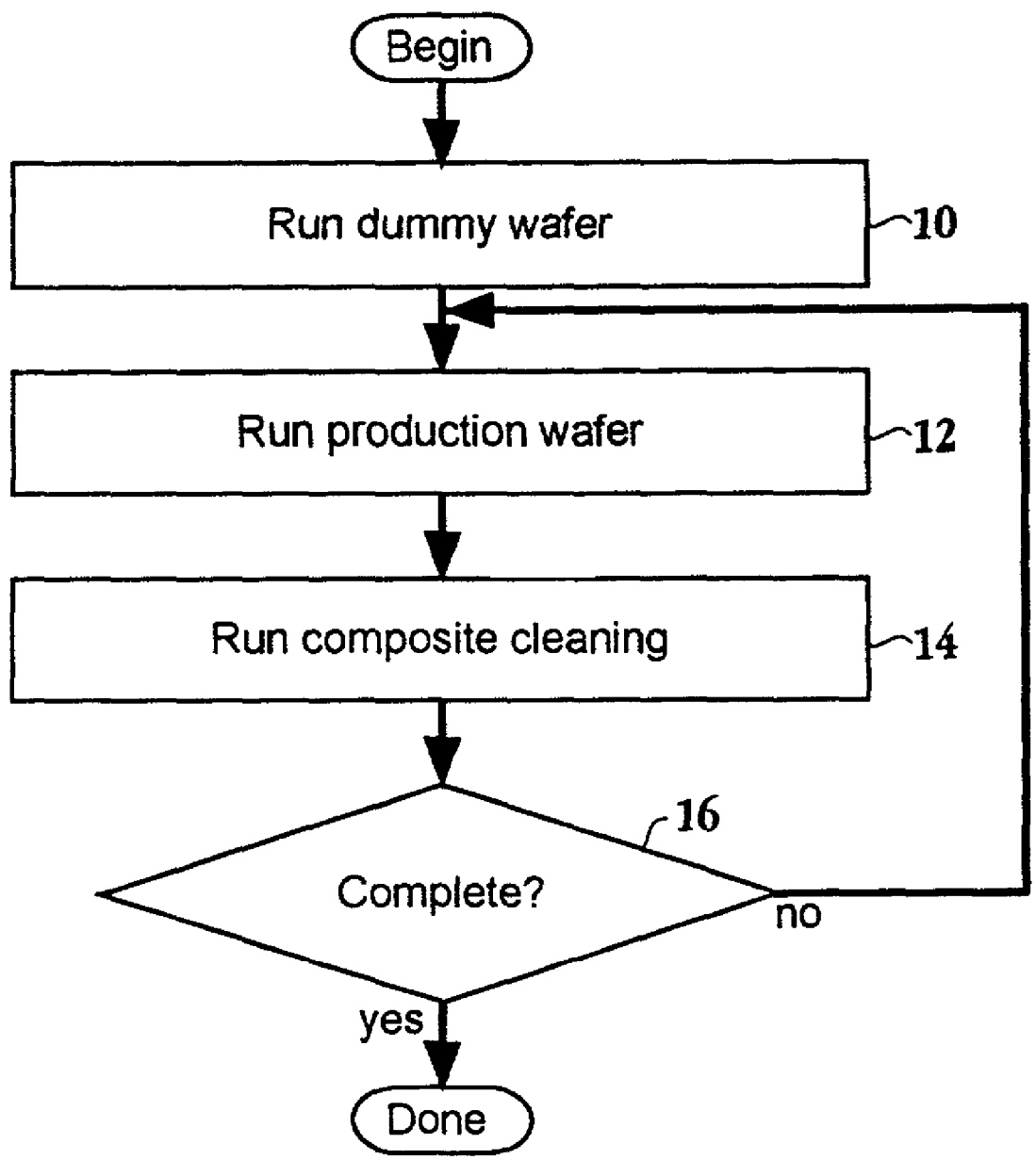
FIG. 1 is a flowchart diagram of the method operations for a composite one step cleaning process for the removal of all chamber deposition byproducts.

An invention is described for providing an optimized dual step wafer-less auto clean method optimized for removing multiple byproducts deposited onto walls of a semiconductor processing chamber. It will be obvious, however, to one skilled in the art, that the present invention may be practiced without some or all of these specific details. In other instances, well known process operations have not been described in detail in order not to obscure the present invention. FIG. 1 is described in the "Background of the Invention" section.

The basic concept of plasma etching is rather direct. A glow discharge is utilized to produce chemically reactive species (neutral atoms, radicals and ions) from a relatively inert molecular gas. The etching gas is selected so as to generate species that react chemically with the material to be etched, and whose reaction product with the etched material is volatile so that it can be removed from the processing chamber.

An ideal dry etch process based solely on chemical mechanisms for material removal, can thus be broken down into six steps: 1) reactive species are generated in a plasma, 2) these species diffuse to the surface of the material being etched, 3) the species are adsorbed on the surface, 4) a chemical reaction occurs with the formation of a volatile byproduct 5) the byproduct is released from the surface, and 6) the released species diffuses into the bulk of the gas. If any of these steps fail to occur, the overall etch cycle ceases. However, when the byproduct is released from the surface it is possible that they are deposited on the inner surface of the chamber. Thus, over time the inner surfaces of the chamber can build up a layer of byproducts that may contaminate a wafer being processed.

In plasma etching processes an RF diode configuration is normally used to establish the glow discharge. The glow discharge is used primarily as a source of energetic ions, which are used to bombard target surfaces and cause sputtering. That is, the glow discharge produces reactive species for chemically etching the surfaces of interest. In plasma etching systems high frequency 13.6 MHz RF diode configurations are primarily used. If a 13.6 MHz frequency is used for the applied RF power, this frequency is high enough so that the ions require several RF cycles to traverse the dark space between the bulk plasma region and the wafer region.

Knowledge about the potential distribution in plasma etching systems is useful because the energy with which particles impinge on the etched surface depends on the potential distribution. In addition, plasma potential determines the energy with which ions strike other surfaces in the chamber, and high-energy bombardment of these surfaces can cause sputtering and consequent redeposition of the sputtered material. Silicon-based residues are often formed on the interior surfaces of a processing operation, such as in deposition and etching operations involving silicon wafers. In addition, carbon based residues can also be formed on the interior surfaces when bombarding photoresists used as masks for patterning of the devices.

The two step wafer-less auto clean (WAC) of the present invention efficiently cleans these deposits and allows for a consistent baseline environment for the beginning of each etch operation. The two step WAC begins by forming a first plasma from process etchant gases introduced into the processing chamber. The first plasma is optimized to react with the silicon-based residues to form volatile gases that may be removed from the chamber's interior. Following the first plasma process, a second plasma is formed from process etchant gases introduced into the processing chamber. The second plasma is optimized to react with the carbon-based residues to form gases that may be removed from the chamber's interior.

Because silicon residues are more prevalent in the chamber, the two step method can be configured to spend more time to ensure removal of the silicon based byproducts and less time so that the carbon based byproducts are removed without over-cleaning. Thus, the two step process will not have a significant impact on the wafer processing throughput of the system as compared to the composite one step process. Additionally, the optimized two step process provides for a more uniform chamber conditioning environment inside the processing chamber between each operation. Consequently, the repeatability of the etch operation from wafer to wafer is enhanced because of the consistent environment provided inside the processing chamber through the two step WAC technique. That is, the build-up of byproducts on the inner surfaces of the processing chamber, over time, is substantially eliminated allowing for stable/repeatable etch rates from wafer to wafer and extended mean time between cleaning (MTBC).

Figure 2:
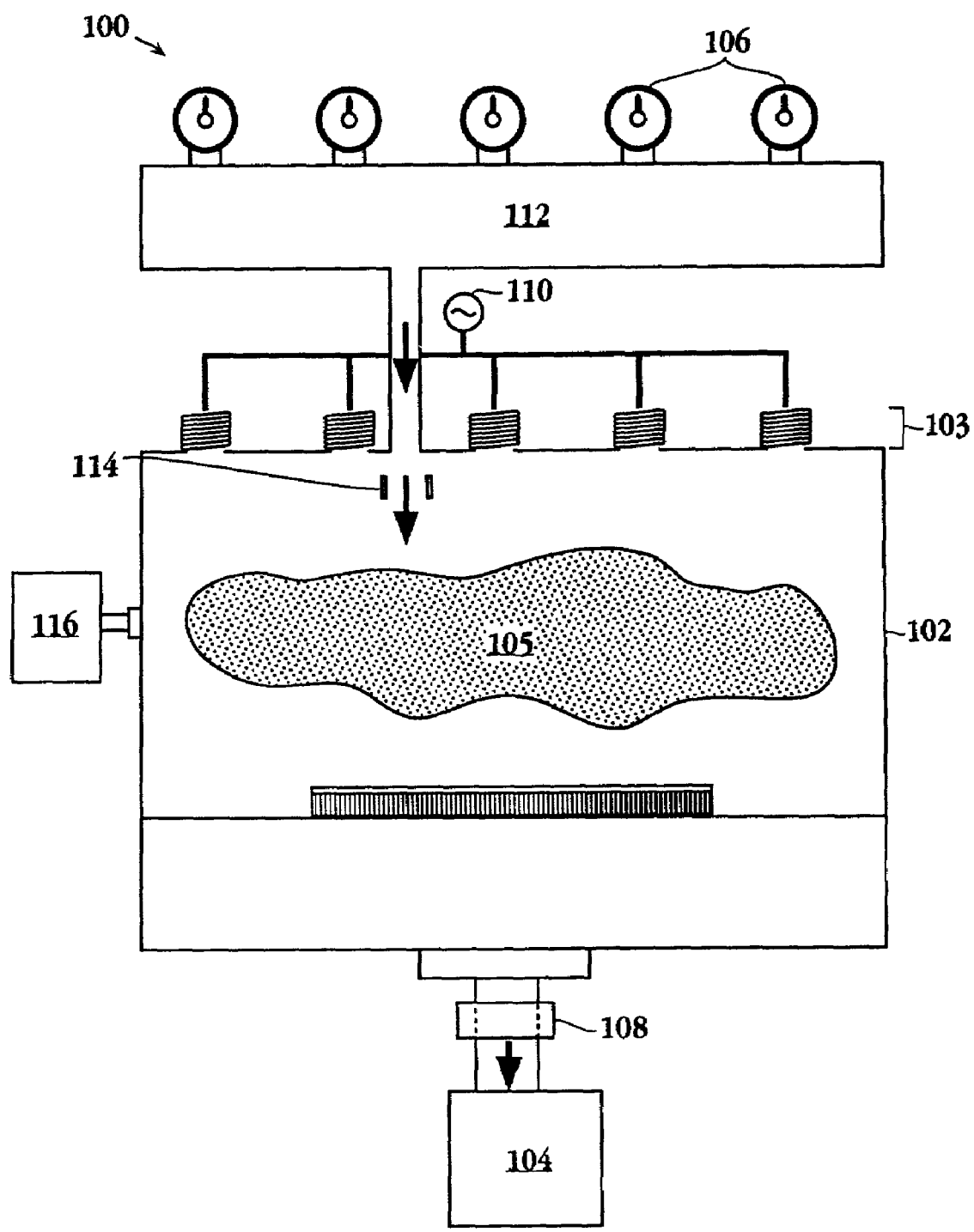
FIG. 2 is a simplified cross-sectional schematic diagram of a plasma etching system configured to execute a dual step cleaning process in accordance with one embodiment of the invention.

FIG. 2 is a simplified cross-sectional schematic diagram of a plasma etching system configured to execute a dual step cleaning process in accordance with one embodiment of the invention. Exemplary plasma etch systems include the 2300 Poly VERSYS Wafer-less Auto Clean System, also referred to as PolyWAC, and the TCP 9400PTX both owned by the assignee. Plasma etching system 100 consists of several components, such as etching chamber 102 that is evacuated to reduced pressure, a pumping system 104 for establishing and maintaining the reduced pressure, pressure gauges 106 to monitor pressure in the chamber, a variable conductance meter 108 between pumping system 104 and etching chamber 102 so that the pressure and flow rate in the etching chamber can be controlled independently. A radio frequency (RF) power supply 110 creates the glow discharge. Gas handler 112 meters and controls the flow of reactant gases. Electrodes 114 can be used to strike a plasma. Optical emission spectroscopy (OES) monitor 116 monitors wavelengths specific to etching chamber 102 deposition removal products and chamber deposition removal reactants. An electrostatic chuck for temperature control and wafer clamping is also included. It should be appreciated that in the past plasma cleans were used for cleaning reactors with the wafer in the reactor chamber to cover the electrode, but it has become more common to do wafer-less plasma cleans. This has led to the use of a wafer-less auto clean (WAC). In one embodiment, the operations are computer controlled to automatically start the wafer-less plasma cleans at set wafer processing intervals. For example, the WAC process can be run after each wafer, after a lot of wafers or after some other suitable interval. In another embodiment, the process parameters discussed below are input as a recipe and the process parameters are controlled by a control system, such as a programmable logic controller that interfaces with the reaction chamber.

The WAC process has conventionally used a composite one-step recipe focused on the removal of all chamber deposition byproducts involving a mixture of etchant gases for the removal of both silicon based byproducts and carbon based byproducts. However, a composite WAC recipe for both silicon and carbon byproduct removal suffers from lower removal rates of both silicon and carbon-based deposition byproducts. In addition, aluminum fluoride compounds left behind in the one step recipe adversely impact etch operations.

As is known in the art, silicon-based residues are often formed on the interior surfaces of a processing operation, such as in deposition and etching operations involving silicon wafers. Carbon based deposition products are also formed on the chamber during processing operations due to carbon based photoresist, often used as the mask for patterning devices. In general, the percentage of silicon based byproducts to carbon based byproducts is not a 1:1 ratio, since silicon based byproducts are found in a greater amount than carbon based byproducts. It will be apparent to one skilled in the art that silicon based byproducts are the predominant chamber deposition species in Polysilicon Etch equipment. The present invention provides a method to clean the inner surfaces of semiconductor processing chamber by forming a plasma from process etchant gases specific and optimized to the byproduct to be removed. That is, the cleaning process for the silicon based byproducts is optimized to efficiently remove silicon based byproducts, while the cleaning process for the carbon based byproducts is optimized to efficiently remove carbon based byproducts. In one embodiment, the targeted byproduct removal process is a two step process where the first step uses $SF_6$ chemistry, or other fluorine based chemistry, such as $NF_3$, to remove silicon based (inorganic) byproducts. The second step uses oxygen ($O_2$) based chemistry to remove carbon based (organic) byproducts from the chamber walls. The cleaning process is preferably performed after each wafer, however, any suitable cleaning frequency may be used. Additionally, the $O_2$ chemistry of the second step assists in the purging of any fluorine in order to substantially prevent the formation of aluminum fluoride compounds in the aluminum processing chambers.

Figure 3:
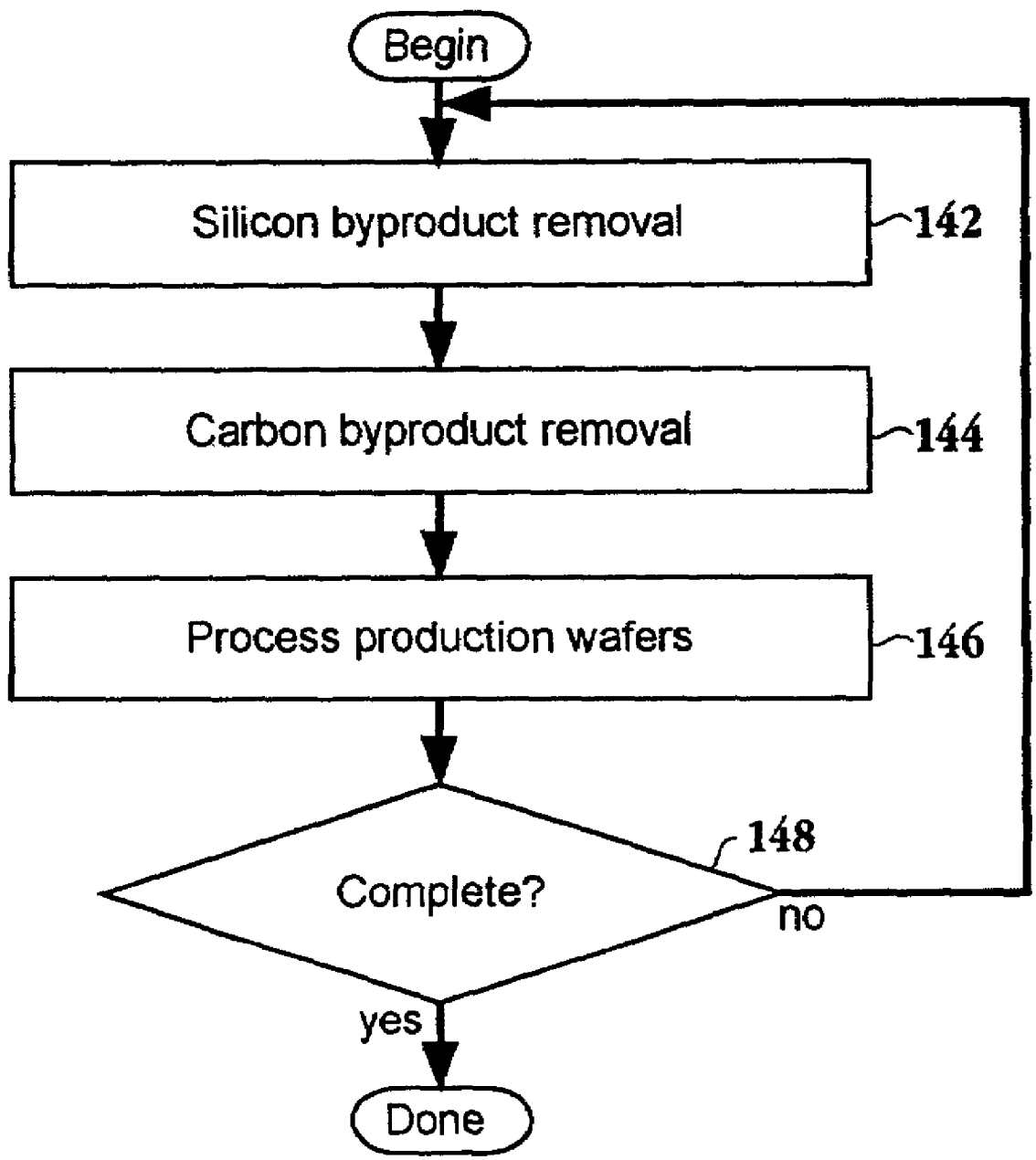
FIG. 3 is a flowchart diagram of the method operations performed for a dual step byproduct removal WAC technique in accordance with one embodiment of the invention.

FIG. 3 is a flowchart diagram of the method operations performed for a dual step byproduct removal WAC technique in accordance with one embodiment of the invention. The method initiates with operation 142 where silicon byproduct is removed. It should be appreciated that operation 142 can be performed following the processing of a wafer or multiple wafers or even following an initial gas stability operation. Here, a fluorine based etchant gas is introduced into the chamber and a plasma is struck. The fluorine based plasma removes the silicon based (inorganic) byproducts from the inner surfaces of the processing chamber. The method then moves to operation 144 where a carbon based (organic) byproduct is removed. Here, an oxygen based ($O_2$) based etchant gas is introduced into the chamber and a plasma is struck. It should be appreciated that the decoupling of the two process steps allows for each process to be optimized for the particular byproduct. As mentioned above, when silicon is the predominant chamber deposition species the time for each process step can be optimized. More specifically, the time for the silicon cleaning step can be lengthened while the time for the carbon cleaning step can be shortened. Thus, the cleaning time does not substantially increase from the cleaning time for the composite WAC process. It should be appreciated that the operations can be performed for a specified amount of time or the cleaning operations can be controlled through software detection of an endpoint.

The method then advances to operation 146 where the production wafers are processed in the chamber. As mentioned above, multiple wafers may be processed in between cleaning operations or a single wafer may be processed in between cleaning operations. The processing performed on the production wafers could be any etch or deposition process, such as Polygate, shallow trench isolation (STI) applications and other suitable semiconductor processing operations that can deposit material on the inner surfaces of the processing chamber. The method then proceeds to decision operation 148 where it is determined if the processing for the wafer is completed. If the processing is not complete, then the method returns to operation 142. The process is repeated until all the wafers have been completed. If it is determined that the processing is complete then the method terminates.

Figure 4:
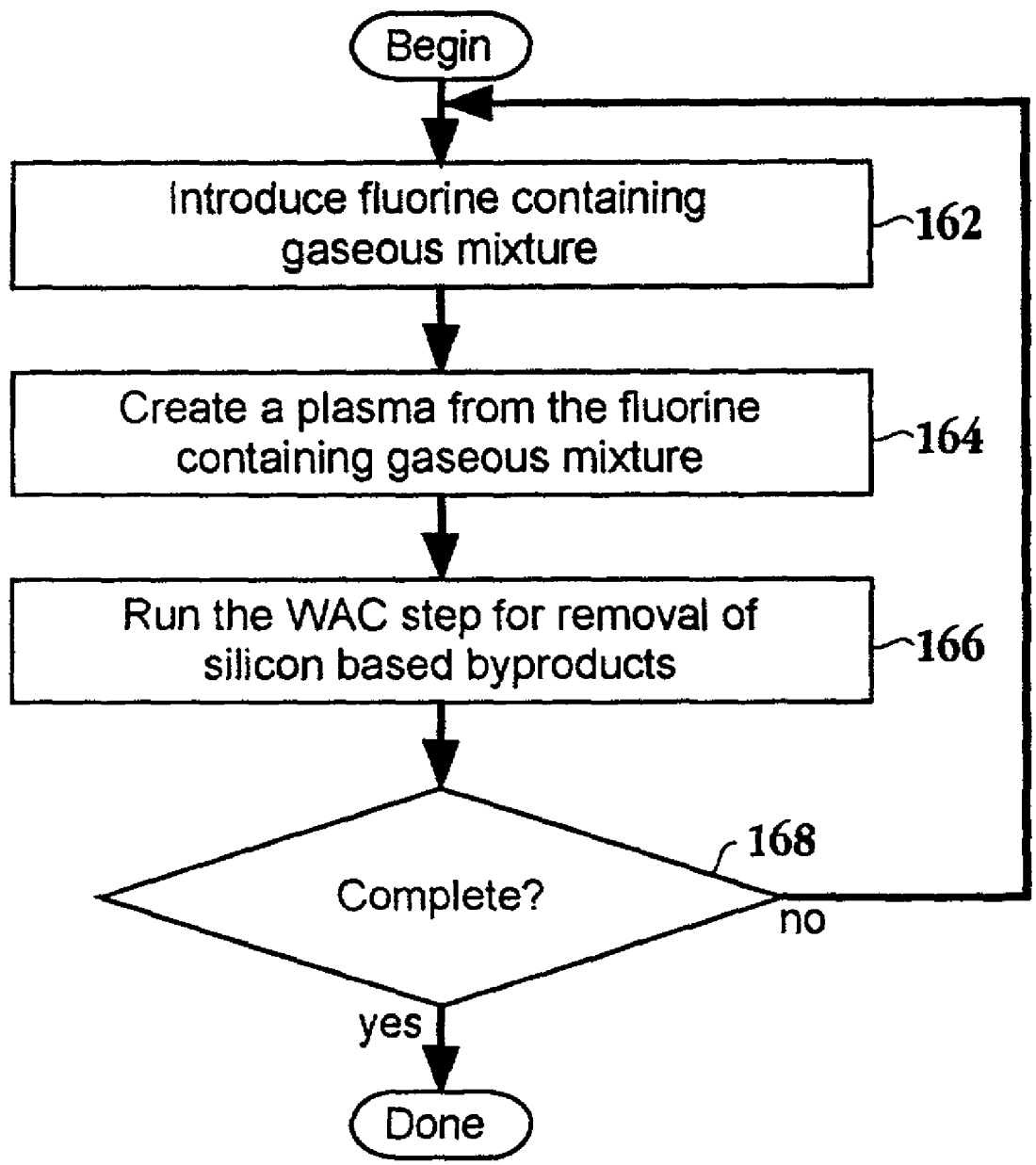
FIG. 4 is a more detailed flowchart diagram of the method operation of removal of silicon byproduct of FIG. 3.

FIG. 4 is a more detailed flowchart diagram of the method operation of removal of silicon byproduct of FIG. 3. The method initiates with operation 162 where a fluorine containing gaseous mixture is introduced into a processing chamber. A suitable processing chamber is the chamber described with reference to FIG. 2. Fluorine is used as an etchant for the removal of silicon based compounds. In one embodiment, the fluorine etchant is a gaseous composition that includes at least about 75% of a fluorine-containing compound of the formula $X_yF_z$, and is introduced into a reaction chamber configured to support a wafer-less auto clean (WAC) process, such as the processing chamber of FIG. 2. The recipe for removing the silicon byproduct with the fluorine etchant is optimized for process parameters such as: temperature, pressure, reactant gas flow rate, transformer coupled plasma power and bias voltage for maximum removal of silicon and silicon based compounds from interior surfaces of the processing chamber. Table 1 below provides process operating ranges for process parameters in accordance with one embodiment of the invention. It should be appreciated that the provided ranges may vary with the different configurations of processing chamber. Furthermore, the ranges of Table 1 are optimal ranges for a plasma etch system, such as the 2300 Poly Wafer-less Auto Clean System or TCP 9400 PTX etch system. As shown below, the flow rate of the fluorine containing gaseous mixture, i.e., $SF_6$, of operation 162 can range from about 50 standard cubic centimeters per minute (sccm) to about 400 sccm in one embodiment of the invention. A preferred range for the flow rate is between about 50 sccm and about 100 sccm.

TABLE 1

| Parameter | Optimal Range | Mid Range | Wide Range |
| --- | --- | --- | --- |
| Pressure | 3 mT | 2–5 mT | <100 mT |
| TCP Power | 1000 W | 800–1000 W | 800–1500 W |
| $SF_6$ Flow | 50 sccm | 50–100 sccm | 50–400 sccm |

The method then advances to operation 164 where a plasma is created from the fluorine containing gaseous mixture. The processing parameters are provided with reference to Table 1. In particular, the pressure can range between about 0 milliTorr (mT) and about 100 mT, with a preferred range of between about 2 mT and about 5 mT. The transformer coupled plasma (TCP) power is between about 800 watts (W) and about 1500 W, with a preferred range of between about 800 W and about 1000 W. One skilled in the art will appreciate that the processing chamber may be configured as a capacitively coupled chamber or an inductively coupled chamber. For a capacitively coupled chamber the bottom power would preferably be set to 0. Additionally, the fluorine containing gas can include a mixture of $SF_6$ and $NF_3$. In one embodiment, the mixture is a 1:1 ratio of the $SF_6$ and $NF_3$ gases. Alternatively, the $NF_3$ can replace the $SF_6$. In another embodiment, the gas mixture may contain a small percentage of $O_2$ to assist in breaking up any fluorine. Here, the $O_2$ flow rate would be between about 0% and about 10% of the $SF_6$ or $NF_3$ flow rate. Preferably, there is no $O_2$ flow rate.

The method of FIG. 4 then proceeds to operation 166 where the WAC step for removal of silicon based byproducts is performed. Here, the silicon clean step, as explained above, is executed with the process parameters set as described above with reference to Table 1. The method then advances to decision operation 168 where it is determined if the silicon byproduct has been removed. In one embodiment, the endpoint is determined by optical emission spectroscopy (OES), such as through OES monitor 116 with reference to FIG. 2.

Figure 5:
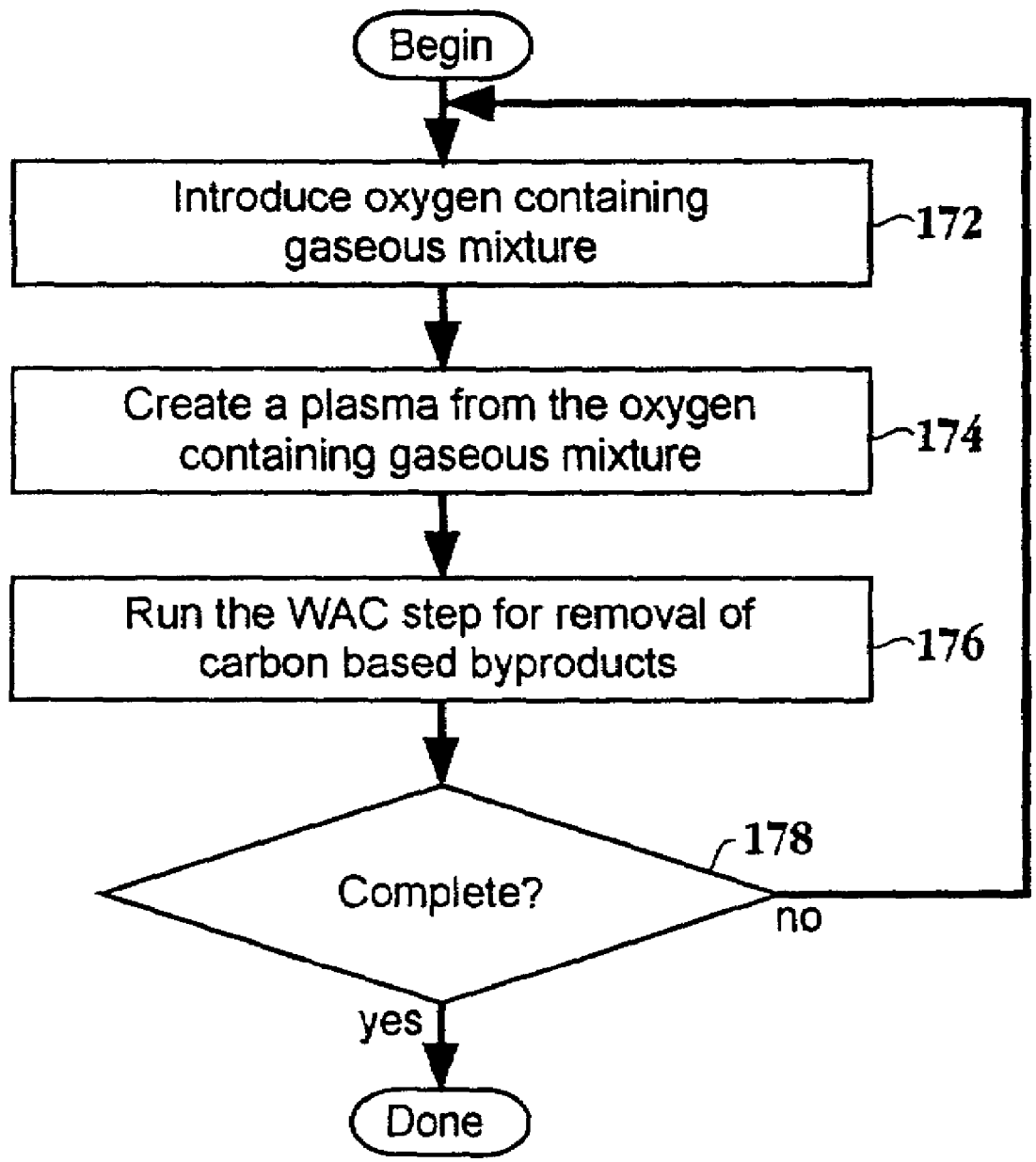
FIG. 5 is a more detailed flowchart diagram of the method operation of removal of carbon byproducts of FIG. 3.

FIG. 5 is a more detailed flowchart diagram of the method operation of removal of carbon byproducts of FIG. 3. The method initiates with operation 172 where an oxygen ($O_2$) containing gaseous mixture is introduced to a semiconductor processing chamber. It should be appreciated that the $O_2$ flow may or may not contain a small percentage of a fluorine containing gas, such as the fluorine containing gas etchants mentioned above with reference to FIG. 4. The recipe for removing the carbon byproduct with the oxygen etchant is optimized for process parameters such as: temperature, pressure, reactant gas flow rate, TCP power and bias voltage for maximum removal of carbon and carbon based compounds from interior surfaces of the processing chamber. Table 2 below provides process operating ranges for process parameters for a carbon clean where a small amount of a fluorine containing gas is optional in accordance with one embodiment of the invention. It should be appreciated that the provided ranges may vary with the different configurations of the processing chamber. Furthermore, the ranges of Table 2 are optimal ranges for a plasma etch system, such as the 2300 Poly Wafer-less Auto Clean System. As shown below, the flow rate of the oxygen containing gaseous mixture of operation 172 can range from about 100 standard cubic centimeters per minute (sccm) to about 600 sccm with a preferred oxygen flow rate of about 100 sccm.

TABLE 2

| Parameter | Optimal Range | Mid Range | Wide Range |
| --- | --- | --- | --- |
| Pressure | 10 mT | 10–40 mT | <100 mT |
| TCP Power | 1000 W | 800–1000 W | 800–1500 W |
| $O_2$ Flow | 100 sccm | 100–500 sccm | 100–600 sccm |
| $SF_6$ Flow (10% $O_2$ Flow Max) | 10 sccm | (0–10% $O_2$ Flow Max) | (0–10% $O_2$ Flow Max) |

The method of FIG. 5 then advances to operation 174 where a plasma is created from the oxygen containing gaseous mixture. The processing parameters are provided with reference to Table 2. For example, the pressure can range between about 0 milliTorr (mT) and about 100 mT with a preferred pressure of about 10 mT. The transformer coupled plasma (TCP) power is between about 800 watts (W) and about 1500 W. One skilled in the art will appreciate that the processing chamber may be configured as a capacitively coupled chamber or an inductively coupled chamber. For a capacitively coupled chamber the bottom power is preferably set to 0. The fluorine containing gas can be introduced at a flow rate of between about 0% and about 10% of the maximum flow rate of the oxygen containing gas. It will be apparent to one skilled in the art that while $SF_6$ is listed as the fluorine containing gas, other fluorine containing gases, such as $NH_3$ can be substituted. In one embodiment, the oxygen containing gas is introduced with an inert gas into the processing chamber. For example, the oxygen containing gas can be mixed with nitrogen, argon, helium, etc. In this embodiment, the inert gas flow rate is between about 0% and 20% of the maximum flow rate of the oxygen containing gas.

The method of FIG. 5 then proceeds to operation 176 where the WAC step for the removal of carbon based byproducts is performed. Here, the carbon clean step, as explained above, is executed with the process parameters set as described with reference to Table 2 or Table 3. In decision operation 178 it is determined if the carbon byproduct has been removed. In one embodiment, the endpoint is determined by optical emission spectroscopy (OES), such as through OES monitor 116 with reference to FIG. 2.

As the addition of a fluorine containing gas is optional during the carbon clean step, Table 3 lists the process parameters for a carbon clean step in which only an oxygen containing gas is used to create a plasma, in accordance with one embodiment of the invention. It should be appreciated that the ranges provided in Table 3 are substantially similar to the ranges provided in Table 2 above, except that Table 3 eliminates the fluorine containing gas.

TABLE 3

| Parameter | Optimal Range | Mid Range | Wide Range |
|---|---|---|---|
| Pressure | 10 mT | 10–40 mT | <100 mT |
| TCP Power | 1000 W | 800–1000 W | 800–1500 W |
| O2Flow | 100 sccm | 100–500 sccm | 100–600 sccm |

It is preferred to perform the two step process with the silicon clean step performed first and the carbon clean step performed second. However, the order of the steps can be reversed. The amount of the fluorine containing gas in the carbon-clean step is limited so that the oxygen containing gas can effectively prevent aluminum fluoride compounds from building up on the inner surfaces of the processing chamber from the carbon clean step. The one step WAC recipe leaves a deposit of aluminum fluoride on the chamber surface.

As discussed above, the endpoints for the silicon clean step and the carbon clean step can employ optical emission spectroscopy (OES) to monitor wavelengths specific to chamber deposition removal products and chamber deposition removal reactants. The specific wavelengths for fluorine containing compounds are 309 nm representative of $SiF_x$ species, 390 nm for SiF2, and 680 nm for reactant fluorine (chemical symbol F). An initial base line constitutes the wavelengths recorded from a clean chamber state and used as threshold or nominal values for OES intensity. The intensity of the specific wavelengths is noted for slope as a function of time. When intensity curves for the specific wavelengths shows zero slope, it is indicative of no additional cleaning occurring and no change in the relative concentration of the reactant or product species. In one embodiment, the WAC endpoint time for the silicon based byproduct is reached when the recommended wavelengths (390 nm, 309 nm or 680 nm) produce the initial clean chamber intensities and intensity curve slope of zero with time. The specific wavelength for oxygen containing compounds (such as carbon monoxide or CO) is 520 nm. Therefore, the WAC endpoint time for the carbon based compounds will be reached when the 520 nm wavelength produces the initial clean chamber intensities and intensity curve slope of zero with time. In the case of carbon based compounds, the intensity slope is noted for oxygen containing compounds since the etchants are oxygen based. It should be appreciated that when fluorine containing compounds are included in the carbon clean, then all the above listed wavelengths can be monitored to determine an endpoint.

Table 4 summarizes the two step WAC recipe in accordance with one embodiment of the invention. As mentioned above, the endpoint times for the silicon clean times and the carbon clean times can be determined based upon a signal for an OES monitor. The OES monitor is configured to detect the appropriate wavelengths and the signals are then compared to a baseline signal of a clean chamber state.

TABLE 4

| | Step Number | | | |
|---|---|---|---|---|
| | 1 | 2 | 3A | 3B |
| Step Type | Stability | Silicon Clean-1 | Carbon Clean-2 ($O_2$ only) | Carbon Clean-2 ($O_2$ + fluorine compound) |
| Pressure | 3 mT | 3 mT | 10 mT | 10 mT |

TABLE 4-continued

| | Step Number | | | |
|---|---|---|---|---|
| | 1 | 2 | 3A | 3B |
| TCP Power | 0 | 1000 W | 1000 W | 1000 W |
| Bias Voltage | 0 | 0 | 0 | 0 |
| $O_2$ | N/A | N/A | 100 sccm | 100 sccm |
| $SF_6$ | 50 sccm | 50 sccm | 10 sccm | 10 sccm |
| Inert gas | N/A | N/A | 20 sccm | N/A |
| Completion basis | Stable | Time | Time | Time |
| Time (sec) | 30 | 17 | 6 | 6 |

One skilled in the art will appreciate that the stability step conditions the environment inside the chamber so the environment is stable and consistent prior to starting the silicon clean step. As mentioned above the carbon clean step can be performed with an oxygen containing compound only or with an oxygen containing compound and a fluorine containing compound. Additionally, an inert gas can be introduced with an oxygen containing compound in step number 3A or 3B. Table 4 is shown for exemplary purposes only and not meant to be limiting. In addition to the process parameters varying between processing chamber designs, values for the parameters within the ranges provided in Tables 1–3 can also be substituted.

As shown by Table 4, the time allotted for the silicon clean step and the carbon clean step can be tailored to the type of process. That is, if the process deposits more silicon based byproducts on the chamber walls, then the silicon clean step is configured to remove the deposited by products without over-cleaning or under-cleaning. In turn, a more consistent environment is provided for substantially eliminating etch rate drift due to varying chamber conditioning. Since the silicon based deposition byproducts are more completely removed as compared to a composite recipe, there is no longer a surface area larger than the wafer for absorbing/desorbing reactant species during etching operations. Similarly, since the carbon based byproducts tend to be accumulated in a lesser amount than the silicon based byproducts, the time allotted for the carbon clean step can be reduced in order to efficiently clean the carbon based byproducts. Accordingly, the overall cleaning time as compared to the one step composite process is not significantly different. While Table 4 provides specific times for each step, each of the steps can be controlled through the detection of an endpoint by an OES monitor configured to detect certain wavelengths. Here, the OES monitor would detect the endpoint and output a signal to trigger the completion of the respective cleaning step.

Figure 6:
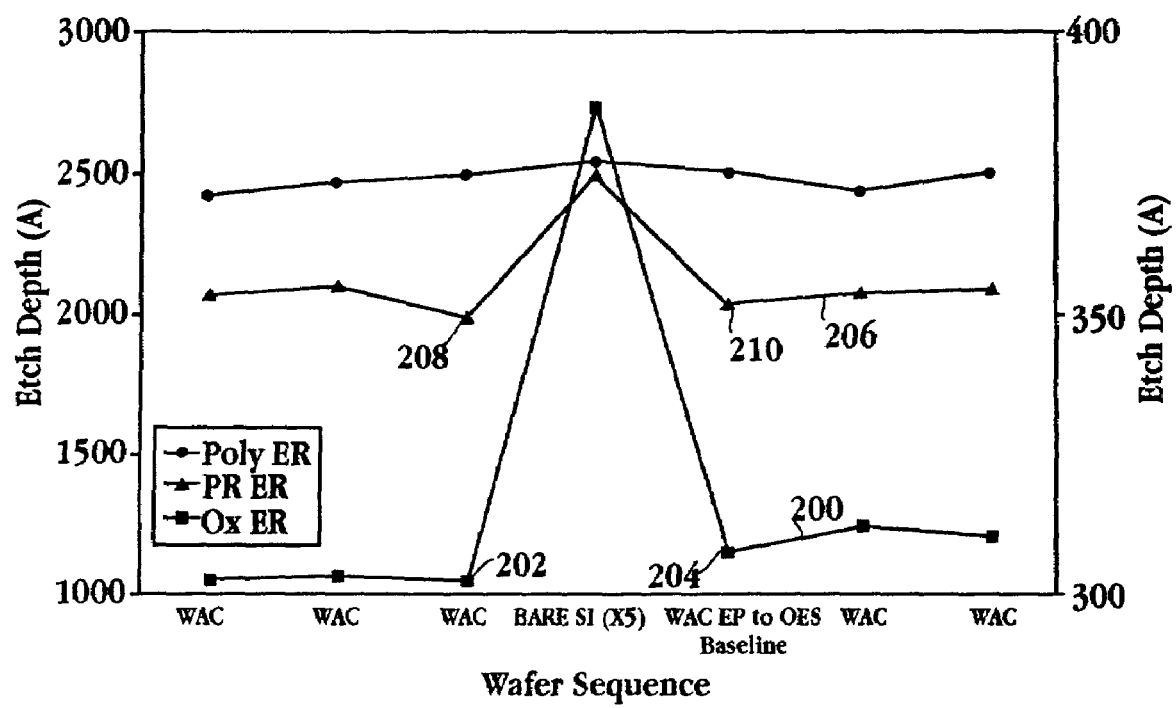
FIG. 6 is a graph depicting the effect of the WAC process on the etch rate performance in accordance with one embodiment of the invention.

FIG. 6 is a graph depicting the effect of the WAC process on the etchrate performance in accordance with one embodiment of the invention. It is known that initial etch rates are lower from a clean chamber until a sufficient number of conditioning wafers are employed to stabilize the etch rate which in turn slowly drifts over the course of the mean time between cleaning (MTBC) cycles. Line 200 represents an oxide etch rate where a WAC is performed at different time periods. A waferless autoclean is performed after each wafer up to point 202. Then, 5 bare silicon wafers are processed after point 202 without performing a WAC. As shown, there is approximately a 27% increase in the oxide etch rate on a pattern oxide wafers without a WAC vs. with a WAC after every wafer. That is, the wafer etched following the 5 bare wafers performed without a WAC, experiences a 27% increase in etch depth. It should be appreciated that at point 204, the WAC is resumed after every wafer.

Still referring to FIG. 6, the photoresist (PR) etch rate, represented by line 206, is similarly impacted when compared with and without WAC performed after every wafer being processed. That is, between point 208 and 210, where 5 bare silicon wafers are processed, there is approximately a 25% increase in the PR etch rate. Likewise, once the WAC are resumed at point 210 the etch rate stabilizes from wafer to wafer. Accordingly, performing the WAC after every cycle provides a constant starting point for each etch operation, thereby enabling minimal variation of the etch rate from wafer to wafer. It should be appreciated that the WAC allows for the repeatability of the etch rate, within a narrow range, for each successive etch operation.

Figure 7:
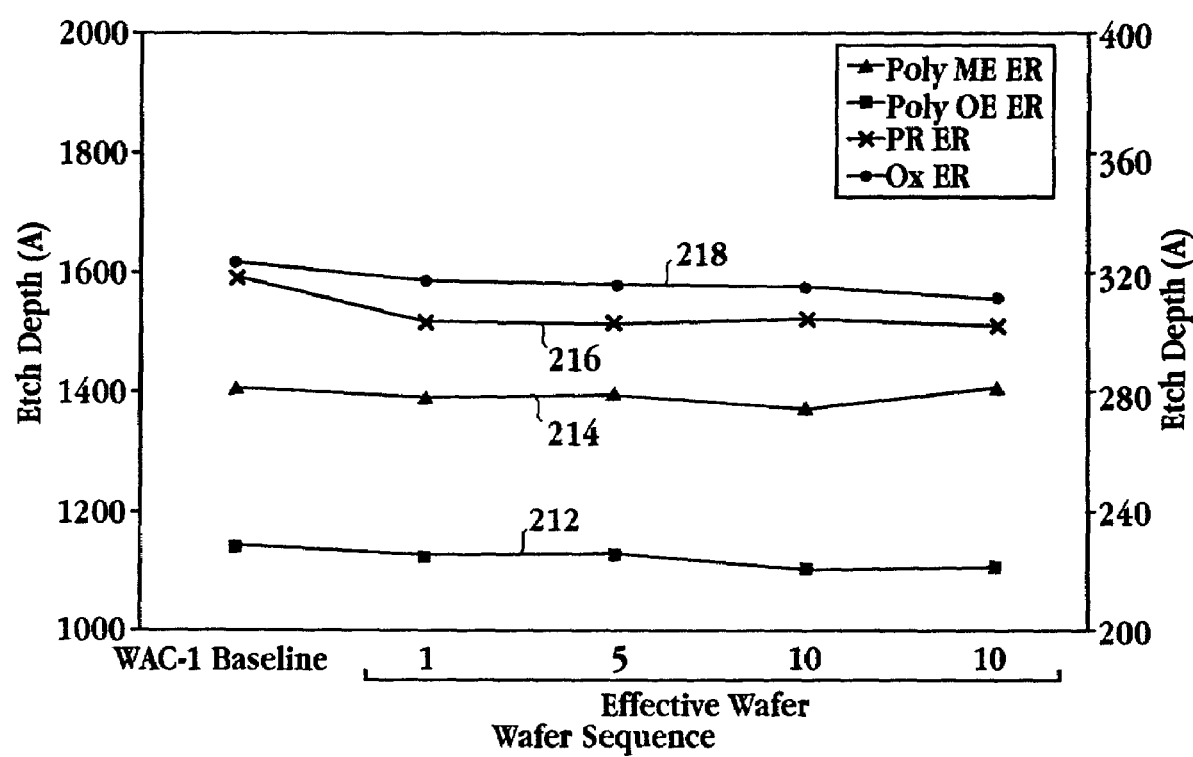
FIG. 7 is a graph of etch rate repeatability using a Polygate Release recipe where a WAC is performed after each wafer in accordance with one embodiment of the invention.

FIG. 7 is a graph of etch rate repeatability using a Polygate Release recipe where a WAC is performed after each wafer in accordance with one embodiment of the invention. Lines 212, 214, 216 and 218 represent poly main etch, poly over etch, oxide main etch and photoresist main etch, respectively. The etch rate repeatability and stability from the first wafer to the $25^{th}$ wafer was measured when a WAC was performed initially and after each wafer was processed. The etch rate repeatability and stability over the 25 wafers with a WAC performed between each wafer was within 0.7% for the poly main etch, 2.6% for the poly over etch, 3.1% for the oxide main etch and 4.6% for the photoresist main etch. Accordingly, by providing a consistent environment from wafer to wafer, along with standardizing the starting conditions through the performance of a WAC that is designed for optimization of each of the silicon and carbon byproducts, tighter control over the etch rates is accomplished. In turn, the critical dimensions defined through the etching processes are controlled within suitable ranges.

In summary, the two step cleaning process is optimized for multiple byproducts to provide a consistent environment for processing operations. The consistent environment allow for the repeatability and reproducibility of the processing operations with minimal wafer to wafer variation. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed:

1. A method for cleaning a processing chamber comprising:
   flowing a first gaseous composition into a processing chamber, the first gaseous composition including at least about 75% of a fluorine-containing compound of the formula $X_yF_z$;
   forming a plasma from the first gaseous composition to provide a first etchant plasma which removes silicon and silicon based compounds from interior surfaces of the processing chamber;
   flowing a second gaseous composition into a processing chamber after removal of the first gaseous composition, the second gaseous composition including at least about 50% $O_2$; and
   forming a plasma from the second gaseous composition to provide a second etchant plasma which removes carbon and carbon based compounds from interior surfaces of the processing chamber.

2. A method for cleaning a processing chamber as recited in claim 1 wherein said fluorine-containing compound is selected from the group consisting essentially of $NF_3$ and $SF_6$.

3. A method for cleaning a processing chamber as recited in claim 2 wherein said fluorine-containing compound is $SF_6$.

4. A method for cleaning a processing chamber as recited in claim 2 wherein said first gaseous composition is at least about 90% of said fluorine-containing compound.

5. A method for cleaning a processing chamber as recited in claim 4 wherein said first gaseous composition essentially consists of said fluorine-containing compound.

6. A method for cleaning a processing chamber as recited in claim 1 wherein said second gaseous composition is at least about 75% $O_2$.

7. A method for cleaning a processing chamber as recited in claim 6 wherein said second gaseous composition is at least about 90% $O_2$.

8. A method for cleaning a processing chamber as recited in claim 6 wherein said second gaseous composition includes a fluorine-containing compound of the formula $X_yF_z$.

9. A method for cleaning a processing chamber as recited in claim 8 wherein said fluorine-containing compound of said second gaseous composition is selected from the group consisting essentially of $NF_3$ and $SF_6$.

10. A method for cleaning a processing chamber as recited in claim 8 wherein said fluorine-containing compound of said second gaseous composition is $SF_6$.

11. A method for cleaning a processing chamber as recited in claim 10 wherein said second gaseous composition is about 90% $O_2$ and 10% $SF_6$.

12. A method for cleaning a processing chamber as recited in claim 6 wherein said second gaseous composition essentially consists of $O_2$.

13. A method for processing wafers comprising:
    first cleaning interior surfaces of a process chamber with a fluoride plasma including at least about 75% of a fluorine-containing compound of the formula $X_yF_z$, said fluoride plasma being optimized to remove silicon and silicon compounds;
    second cleaning said interior surfaces of said process chamber with an oxygen plasma including at least about 50% $O_2$, said oxygen plasma being optimized to remove carbon and carbon compounds; and
    processing a wafer within said process chamber after said first cleaning and said second cleaning.

14. A method for cleaning a processing chamber as recited in claim 13 wherein said fluorine-containing compound is selected from the group consisting essentially of $NF_3$ and $SF_6$.

15. A method for cleaning a processing chamber as recited in claim 14 wherein the first cleaning lasts for about 17 seconds and the second cleaning lasts for about 6 seconds.

16. A method for cleaning a processing chamber as recited in claim 14 wherein the method operation of first cleaning interior surfaces of a process chamber with a fluoride plasma further includes:
    maintaining a chamber pressure between about 2 milliTorr and 5 milliTorr;
    applying a TCP power of about 1000 watts;
    introducing the fluoride containing compound into the processing chamber at a flow rate between about 50 standard cubic centimeters per minute (sccm) and about 40 sccm.

17. A method for cleaning a processing chamber as recited in claim 15 wherein said first gaseous composition essentially consists of said fluorine-containing compound.

18. A method for cleaning a processing chamber as recited in claim 13 wherein said second gaseous composition is at least about 75% $O_2$.

19. A method for cleaning a processing chamber as recited in claim 18 wherein said second gaseous composition is at least about 90% $O_2$.

20. A method for cleaning a processing chamber as recited in claim 19 wherein said second gaseous composition includes a fluorine-containing compound of the formula $X_yF_z$.

21. A method for cleaning a processing chamber as recited in claim 20 wherein said fluorine-containing compound of said second gaseous composition is selected from the group consisting essentially of $NF_3$ and $SF_6$.

22. A method for cleaning a processing chamber as recited in claim 21 wherein said fluorine-containing compound of said second gaseous composition is $SF_6$.

23. A method for cleaning a processing chamber as recited in claim 22 wherein said second gaseous composition is about 90% $O_2$ and 10% $SF_6$.

24. A method for cleaning a processing chamber as recited in claim 23 wherein said second gaseous composition essentially consists of $O_2$.

25. A method for cleaning interior surfaces of a processing chamber, comprising:
 flowing a first etchant process gas with a fluorine-containing compound of the formula $X_yF_z$, said fluorine-containing compound being optimized to remove silicon and silicon compounds;
 forming a plasma from said first etchant process gas;
 flowing a second etchant process gas containing oxygen upon removal of the first etchant gas, said process gas being optimized to remove carbon based compounds and an optional fluorine-containing compound of the formula $X_xF_z$, said fluorine-containing compound being optimized to remove silicon and silicon compounds;
 forming a plasma from said second etchant process gas;
 maintaining a pressure in the processing chamber between about 2 mTorr and about 100 mTorr; and
 monitoring said process for carbon-based compounds on interior surfaces of said processing chamber for reaching a predetermined level.

26. A method for cleaning interior surfaces of a processing chamber as recited in claim 25 wherein said optional fluorine containing compound is selected from the group consisting essentially of $NF_3$ and $SF_6$.

27. A method for cleaning interior surfaces of a processing chamber as recited in claim 25 wherein the second etchant process gas is essentially oxygen and a flow rate of the process gas is about 100 standard cubic centimeters per minute.

28. A method for cleaning interior surfaces of a processing chamber as recited in claim 25, further including:
 introducing the second etchant process gas containing oxygen into the processing chamber at a flow rate between about 100 standard cubic centimeters per minute (sccm) and about 600 sccm; and
 applying a TCP power between about 800 Watts and 1500 Watts.

29. A method for cleaning interior surfaces of a processing chamber as recited in claim 28 wherein said second etchant process gas containing oxygen is at least about 90% $O_2$.

* * * * *